United States Patent
Prazeres da Costa et al.

(10) Patent No.: US 6,756,777 B2
(45) Date of Patent: *Jun. 29, 2004

(54) METHOD FOR MANUFACTURING SMART CARD AND IDENTIFICATION DEVICES AND THE LIKE

(75) Inventors: Homem Cristo Prazeres da Costa, Taufkirchen (DE); Anton Thoma, Unterfoehring (DE)

(73) Assignee: Teradyne, Inc., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/210,596

(22) Filed: Aug. 1, 2002

(65) Prior Publication Data

US 2002/0186004 A1 Dec. 12, 2002

Related U.S. Application Data

(62) Division of application No. 09/638,829, filed on Aug. 14, 2000, now Pat. No. 6,466,007.

(51) Int. Cl.$^7$ ................... G01R 31/00; G01R 31/26; G01R 31/28
(52) U.S. Cl. ............ 324/158.1; 324/765; 714/738
(58) Field of Search .............. 324/158.1, 765, 324/757, 763, 76.14, 638, 646; 702/89, 117, 118; 714/724, 738, 718, 735, 736, 737, 824

(56) References Cited

U.S. PATENT DOCUMENTS

| | | | | |
|---|---|---|---|---|
| 5,794,175 A | * | 8/1998 | Conner | 324/158.1 |
| 6,249,128 B1 | * | 6/2001 | Begg | 324/158.1 |
| 6,466,007 B1 | * | 10/2002 | Prazeres da Costa et al. | 324/158.1 |

* cited by examiner

Primary Examiner—Albert Decady
Assistant Examiner—James C. Kerveros
(74) Attorney, Agent, or Firm—Lance Kreisman (57) ABSTRACT

An automatic test system for testing smart card chips. The system includes synchronization circuitry that allows response signals generated at random times after a stimulus to be synchronized with a pattern generator. The described system has multiple paths in the synchronization circuitry that allows responses from several devices under test to be synchronized with each other so that parallel testing is supported. The system is well adapted for testing of smart card chips because such chips often respond to stimulus at random times. Other adaptations are included for testing of smart card chips. These adaptations include circuitry to generate a modulated RF carrier signal and signal processing circuitry that can detect modulation imposed on the RF carrier, allowing the smart card chip to be tested without modifications to the device for test access.

6 Claims, 5 Drawing Sheets

METHOD FOR MANUFACTURING SMART CARD AND IDENTIFICATION DEVICES AND THE LIKE

This is a divisional of U.S. application Ser. No. 09/638,829, filed Aug. 14, 2000, now U.S. Pat. No. 6,466,007 entitled "Test System For Smart Card and Identification Devices and The Like."

This invention relates generally to the manufacture of electronic devices and more particularly to the testing chips used to make smart cards during their manufacture.

"Smart cards" refers to a new type of device that is highly portable but can store information in digital form. Smart cards can be made with dimensions of a few centimeters by a few centimeters with a thickness of less than a millimeter. They can be made, for example in the size of a conventional credit card. When held near a device called a "reader," the smart card can exchange information with a computerized system.

There are many applications for smart cards. One example of a smart card, is identification cards used in connection with building security systems. An identification card can be issued to each person using the building and will store a security code unique to that individual. Readers can be placed near locked doors in the building. When the identification card is held near the reader, the reader can access the security code on the smart card. The security system can then know which individual wishes to pass through the locked door and only unlock the door if that person is authorized.

In some countries, smart cards are being used to replace standard credit or debit cards. In addition to storing identifying information about authorized users of the card, the card could store data about transactions or account balances. Others have attached smart cards to livestock in herds such that the activities of each individual animal can be tracked. Others propose that identification cards, or "tags", be attached to articles for sale in stores for price labeling and inventory control. Herein, the term "smart card" will be used to generally describe devices such as credit cards with embedded chips, identification cards and tags as described above. Though it should be appreciated that smart cards come in many forms.

There are many applications for smart card technology, though the wide spread use depends on such devices being relatively low cost and also being reliable. Thus, it is highly desirable for the manufacturing operation for smart cards, including testing, to be low cost and lead to reliable products. Low cost is particularly important for smart cards used for identification cards or tags.

In some smart cards, the chips inside the smart cards communicate with the reader through direct connections. However, some smart cards communicate with a reader through an RFID interface without direct contact between the card and the reader. The integrated circuit chip inside the smart card both communicates and receives power to operate through the RFID interface. The reader generates an RF carrier signal. A conducting loop is embedded in the smart card and is attached to terminals of the integrated circuit chip. The RF signal couples through this loop to the integrated circuit chip. Circuitry inside the integrated circuit chip can rectify the received carrier signal and extract the power needed to operate the entire chip.

The RF carrier signal is also used to convey information between the reader and the integrated circuit chip. To send information from the reader to the smart card, the reader modulates the carrier signal. The chip can demodulate the carrier and extract the information. To send information back, the integrated circuit chip in the smart card changes the impedance at its terminals connected to the conducting loop. In much the same way that changing the load on one side of a transformer changes the signal on the other side of a transformer, a change in the impedance at the terminals of the chip on the smart card causes a measurable effect to a signal in the reader. By modulating the impedance at its terminals, the smart card can modulate a signal that can be detected on the reader and thus send information to the reader.

Generally, integrated circuit chips are tested during their manufacture with automated test equipment. This equipment is designed to test many chips rapidly, because high throughput in a manufacturing operation usually leads to lower cost. The Integra J750 sold by Teradyne, Inc. is an example of a test system well suited for low cost test of semiconductor devices and can test many devices in parallel.

However, such testers are not directly applicable to testing smart card chips. One problem is that it is difficult to get access to the chips for testing, particularly for chips intended for use with an RFID interface. It would be desirable to test the chips before they are embedded in cards, but, until the chips are embedded into cards, they are not connected to the conductive loop that provides power and communications with the chip. One way that this problem has been solved is through the use of special purpose test devices.

Another difficulty is that existing automatic test equipment designed for testing low cost digital signals is not equipped to demodulate RF signals. While some testers, such as the Catalyst sold by Teradyne, Inc. do contain instruments that could demodulate an RF signal, such testers are not well suited for fast testing of many small and low cost devices. One way that this problem has been solved is through modification of the chips to include a test port so that the load imposed by the chip at its I/O terminals can be measured. However, the increase in size of the chip to accommodate the test port is undesirable because it increases the overall cost of the chip. In addition, a traditional test system measures a load as a dc measurement using a parametric measurement unit (PMU). Use of the PMU is undesirable because it leads to slow testing. Further, when testing is done through test ports, the RFID interface is not included in the test and a chip with a faulty RFID might be passed as good.

Another difficulty is that it would be desirable to test many devices at the same time to reduce the total cost of manufacturing smart cards, but current automatic test equipment is not well suited for this purpose because the time at which each chip responds to commands might vary.

A further difficulty is that some smart card chips vary the load at their I/O terminals by changing the resistance between the terminals. Other smart card chips vary the load by changing the capacitance. The modulation on the carrier signal will be in different form, depending on the type of load imposed. If a general purpose tester were to be used to test smart card chips, it would be highly desirable if it would work on all types of smart card chips, regardless of whether the chip modulated the carrier with a resistive or a capacitive load.

SUMMARY OF THE INVENTION

With the foregoing background in mind, it is an object of the invention to enable low cost test of integrated circuit chips intended for use in smart cards.

The foregoing and other objects are achieved in an automatic test system having circuitry that can interface to a chip through an RF interface.

One inventive feature is that the automatic test system has circuitry to modulate a RF carrier signal with data that is synchronized to circuitry in the tester that can generate and measure digital signals.

Another inventive feature is that the automatic test system has circuitry to demodulate a RF carrier signal.

Another inventive feature is that the automatic test system can synchronize responses of multiple chips so that the results of multiple chips can be simply evaluated in parallel.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
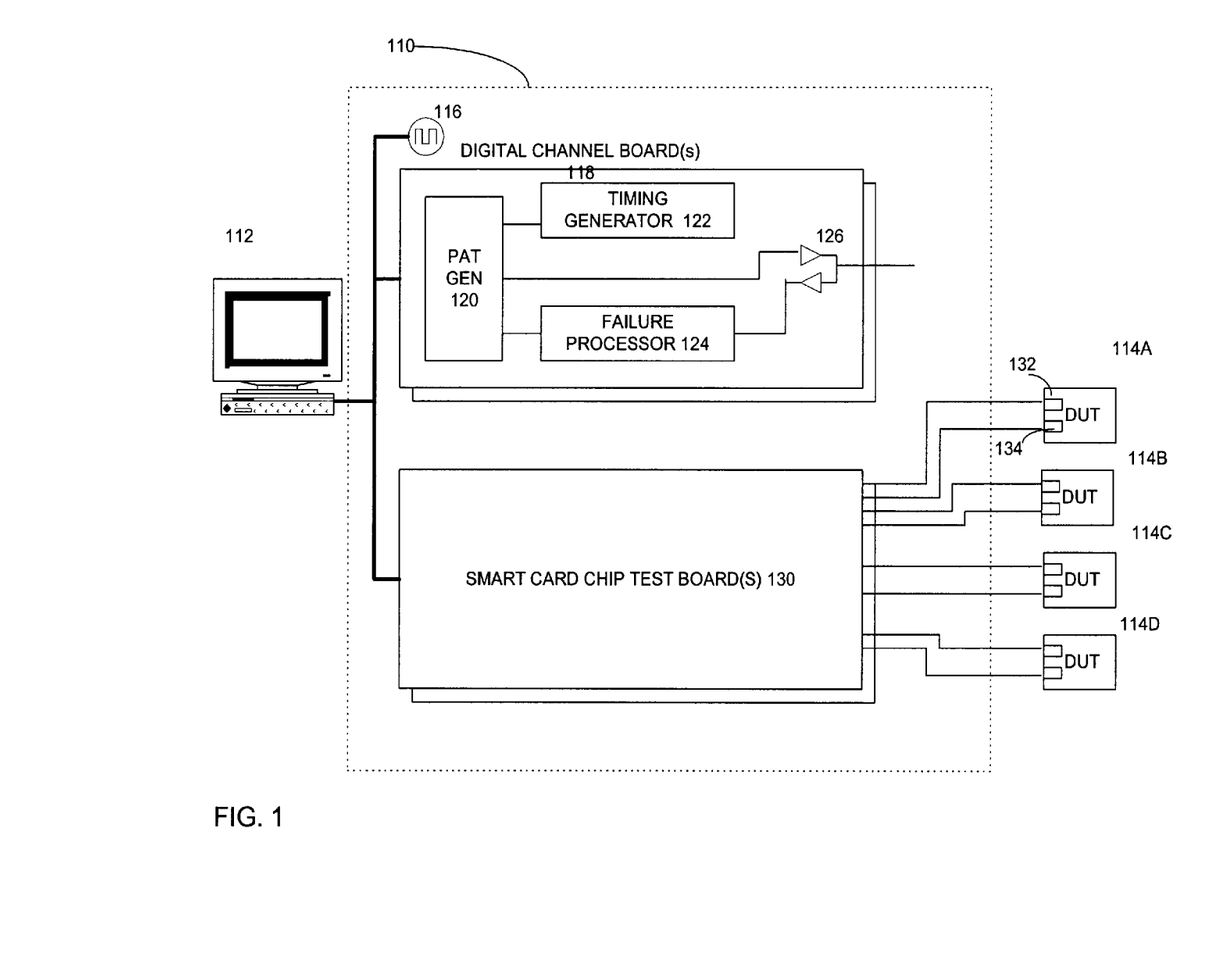
FIG. 1 shows a test system incorporating the invention.

FIG. 1 shows an automatic test system that can quickly and efficiently test chips for use in smart cards. As in conventional automatic test systems, a work station 112 is used as a controller. The controller 112 communicates with various boards inside a tester 110. In general, work station 112 provides an operator interface to the tester 110. It contains a test program that sets up the hardware inside tester 110 and then starts operation of the hardware to perform a specific test. When the test is completed, work station 112 receives the results and presents them to the operator or otherwise processes the data from the test. All these operations are well known in the tester art.

As in a conventional tester, tester 110 includes a tester clock 116. In a typical low cost test system, the clock would have a frequency of 100 to 200 MHz. The tester clock is distributed to the various electronic subsystems within tester 110 to coordinate the time of operation of the subsystems.

Tester 110 also contains a digital channel board 118. Digital channel board 118 is a conventional digital channel board as found in other testers. The channel board contains the circuitry for one or more digital channels. In a conventional tester, a single board would likely contain circuitry for between 8 and 64 channels, though circuitry for only one channel is shown. Also, a test system would likely contain several channel boards so that tester 110 can generate hundreds of test signals at a time, allowing several chips to be tested at one time.

Digital channel board 118 contains a driver/comparator circuit 126 that can be connected to a lead of a device under test. Driver/comparator circuit 126 can be programmed for every cycle of the tester clock 116 to generate a particular digital value to provide to a lead of the device under test. Alternatively, driver/comparator circuit 126 can be programmed for each tester cycle to measure a value generated by a device under test and match it to an expected value.

The specific operation performed by driver/comparator circuit 126 during each cycle is controlled by pattern generator 120. In a tester, the "pattern" acts like a program that specifies the digital values that are applied to or expected from a device under test. The pattern contains data values and the time at which the data values are to be generated or expected. In some testers, the pattern can also contain information about the format of the signals used to represent a digital 1 or 0. To achieve this result, pattern generator 120 contains memory and sequencer logic.

Information about the timing of the signals to be generated by driver/comparator circuit 126 is sent to timing generator 126. In general, the timing of digital signals are specified by transitions of signal levels. Depending on the format of a particular signal, these transitions will occur at certain time or in certain windows of time relative to the start of a period of the tester clock. The timing generator 122 produces a series of signals, sometimes called "edges" at programmed times relative to the start of a period of the system clock. These edges are provided to driver/comparator circuit 126 and act as control inputs that trigger driver/comparator circuit 126 to either change its drive state or to start or stop a measurement. The effect these timing signals have depends on the pattern data supplied to drive/comparator circuit 126 from pattern generator 120. In a conventional tester, these timing signals can be programmed to occur at times that are not integer multiples of the tester clock. However, the time of the edge signals is derived by identifying the start of the tester clock period that is closest to the programmed time and then generating a fine delay until the required time.

Thus, the timing of these edge signals is correlated to the tester clock. When measuring responses from a device under test, this correlation is generally desirable. The signals that provide the stimulus to the device under test are also provided at times correlated to the tester clock. Because, for most devices under test, the response should occur at a predetermined time after the stimulus, it is useful to measure the responses from the device at times that are also correlated to the tester clock.

When driver/comparator circuit 126 is used to measure responses, its output is provided to failure processor 124. As for the drive signals, pattern generator 120 provides the information to timing generator 122 to control the formation of edges that control the timing of the comparison process. Pattern generator 120 also provides the expected value to failure processor 124. Failure processor 124 compares the actual result measured by driver/comparator 126 with the expected value. Depending on the precise design of the tester, failure processor can perform many different types of actions. In a simple form, failure processor 124 can indicate that the device being tested failed if the expected results do not match the actual results. Other functions that a failure processor might perform include storing the actual and expected values when there is a failure. A failure processor might also work in conjunction with pattern generator to synchronize a device under test to the tester. For example, the pattern generator might repeat the same step in a pattern until the failure processor produces a signal indicating that the output of the device under test matches a particular expected value.

FIG. 1 shows a single digital channel. In a commercial tester, there would be numerous driver/comparator circuits in a digital channel board. Pattern generator 120 would generate pattern data for all the channels. Likewise, failure processor 124 would store failure information for all the channels and timing generator 122 would generate timing information used by all channels.

Many of the functions of the digital channel circuit are also needs to test smart card chips. However, additional functions are required for the efficient testing of smart card chips. FIG. 1 shows that tester 110 also includes a smart card chip test board 130. Smart card chip test board 130 is shown connected to a plurality of devices under test (DUT) 114A . . . 114D. IN FIG. 1, the board is shown connected to four devices. In a preferred embodiment, a single board will have connections to DUTs, but only 4 DUTs are shown in FIG. 2 simplicity.

Each of the DUTs 114A . . . 114D has two pads 132 and 134 connected to the smart card chip test board 130. Pads 132 and 134 represent the points where RFID interface of smart card chips 114 would be connected to an inductive loop inside a smart card. As is known in the art, a test system can be connected with semiconductor chips before they are packaged using a device called a "prober." Such a device provides an automated way to quickly connect multiple devices to a test system. However, other mechanisms to connect chips under test to test system 110 could be used.

Figure 2:
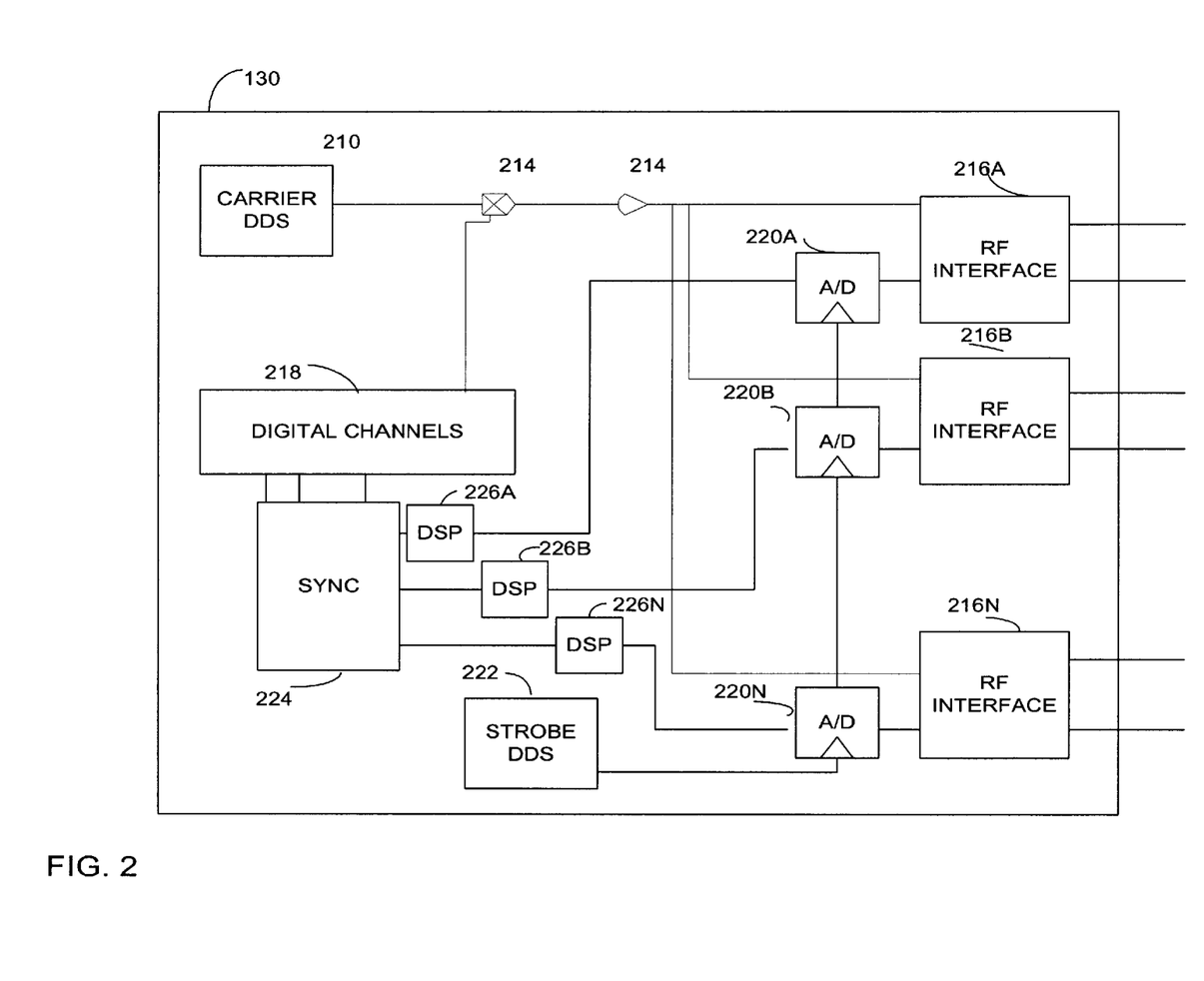
FIG. 2 shows the smart card test board of FIG. 1 in greater detail.

Turning now to FIG. 2, additional details of smart card chip test board 130 are shown. Board 130 contains digital channels 218. Digital channels 218 represent the circuitry that is described above as being on a traditional digital channel board 118. As described above, each digital channel generates or measures a test signal that is connected to a lead of a device under test. The test signal is generated according to a pattern that is programmed by the user of the test system to test a particular kind of chip. As with testing a conventional chip, a smart card chip is tested with a pattern that specifies stimulus and expected response data.

Digital channels 218 contains enough circuits to test multiple smart card test chips simultaneously. As described above, each smart card chip test board 130 can simultaneously test up to 16 smart card chips. Consequently, in preferred embodiment digital channels 218 contains circuitry for 16 digital channels.

It will be appreciated, though, that some simplifications might be made because each chip receives the same stimulus data and the expected response is the same for each chip. Thus, one pattern generator might feed all of the digital channels provided the signals sent to and received from each chip being tested are synchronized. Synchronization circuitry 224 to make this possible is described below.

The stimulus data to be applied to the smart card chips under test is provided by digital channels 218 to mixer 214. For a smart card chip, the input data is provided by modulating an RF carrier signal. The data from digital channels 218 provides the data to modulate an RF carrier signal. The RF carrier signal is provided by carrier DDS 210.

Carrier DDS 210 is a circuit that generates a signal of the desired carrier frequency. In the preferred embodiment, the carrier signal is generated using a technique called direct digital synthesis, or DDS. DDS is a known technique. Chips that perform this function can be commercially obtained, or circuitry that performs this function can be implemented in Applications Specific Integrated Circuits (ASICs).

DDS has the advantage that the output frequency can be programmed. Thus, a user can program test system 110 to test smart card chips regardless of the carrier frequency for which they are designed to operate. An additional benefit of using DDS is that the generated signal will be synchronized to the input clock. In the illustrated embodiment, carrier DDS 210 is connected to tester clock 116 such that the carrier waveform will be synchronized to tester clock 116.

The synthesized carrier is also provided to mixer 214 where it is mixed with the stimulus data from digital channels 218. The modulated carrier signal is then provided to amplifier 214.

Amplifier 214 amplifies the carrier signal such that it might be applied to multiple RF interface circuits 216A . . . 216N. In a preferred embodiment, there will be one RF interface circuit 216A . . . 216N for each smart card chip to be tested in parallel.

The details of an RF interface circuit 216, which is representative of RF interface circuits 216A . . . 216N, are shown in connection with FIG. 3, below. Suffice it to say here that RF interface 216 has a test output port through which an RF carrier signal is coupled to pads 132 and 134 of a smart card chip under test. Each RF interface circuit 216 also couples the carrier signal to measurement circuitry on smart card chip test board 130.

The measurement circuitry allows smart chip test board 130 to measure responses from the chip under test. The responses are passed to digital channels 218 and processed in the same way that response signals are conventionally processed in digital channel board 118. For example, failure processors within digital channels 218 can determine whether the measured response signals from a smart chip under test do not match the expected response and thereby indicate a fault in the chip under test.

The measurement circuitry in the preferred embodiment includes analog to digital converters 220A . . . 220N, strobe circuitry 222, digital signal processors 226A . . . 226N and synchronization circuitry 224. As described above, responses from a smart card chip are usually indicated by modulation of a carrier. The measurement circuitry is designed to extract the response by demodulating the carrier. Additionally, in the preferred embodiment, the measurement circuitry synchronizes the responses from the multiple chips being tested so that the responses may be presented to the digital channels 218 as synchronized data streams.

Synchronization is used in smart card chip test board 130 because the time at which each chip responds can vary widely. The responses have to be synchronized with the expected responses that are generated by the pattern generator. In the illustrated embodiment, a single pattern generator can be used for testing multiple smart card test chips. In addition to synchronizing the responses with the pattern generator, the responses from the various chips must be synchronized with each other.

FIG. 2 shows that the RF carriers coupled to each of the chips under test is digitized by analog to digital converters 220A . . . 220N. Each of the A/D converters 220A . . . 220N is clocked by a signal generated by strobe circuit 222. The described embodiment is intended for testing smart card chips in which the chip under test indicates a response by modulating the same RF carrier that is applied to it. In this case, the strobe circuit is another DDS circuit that is also clocked by tester clock 116. In this way, the outputs of carrier DDS 210 and strobe DDS 222 are synchronized. However, strobe DDS 222 is set to generate pulses at twice the frequency at which carrier DDS 210 operates. Thus, each of the A/D's 220A . . . 220N captures two samples per cycle of the carrier signal.

The samples from each of the chips under test is passed to one of the digital signal processing circuits 226A . . . 226N. As described above, a response from the device under test is represented by modulation on the carrier signal. If the chip under test modulates the carrier by varying the resistance of the load, the modulation will be in the amplitude of the carrier. If the chip under test modulates the carrier by varying the capacitance of the load, the modulation will be in the phase of the carrier. Digital signal processing circuits 226A . . . 226N are preferably able to detect modulation regardless of the form of the modulation.

By detecting modulation on the carriers, DSP circuits 226A . . . 226N are able to output a stream of digital values representing the responses from the chips under test. The stream of digital values could be in the form of 1's and 0's, indicating that the carrier is modulated at a given point in time or is unmodulated. In a conventional tester, the output of a comparator can be represented in multiple bits, indicating that the measured signal is above an upper threshold value, below a lower threshold value or somewhere between the upper and lower values. Using multiple bits increases the accuracy of the test because, values in between the upper and lower value represent a state that is usually not allowed and can help identify incorrect operation of the device. DSP circuits 226A . . . 226N can, if desired be programmed to output multiple bits of information to indicate whether the amount of modulation is above an upper threshold, below a lower threshold or in between the thresholds.

The operation of DSP's 226A . . . 226N is described below in conjunction with FIG. 5, below. DSP chips can be purchased commercially and programmed to perform a variety of digital signal processing operations. They can thus be programmed to detect the presence or absence of modulation on a carrier or to detect the level of modulation. Alternatively, DSP circuits can be included in ASICs, using well known design techniques. The specific implementation of the DSP is not important to the invention.

The outputs of DSP's 226A . . . 226N, which represent the response signals from the chips under test are passed to synchronization circuit 224. Synchronization circuit 224 is described in conjunction with FIG. 4, below. Circuit 224 ensures that the responses from each chip under test are synchronized to each other and presented to the digital channels in a way that is synchronized with the expected response data from the digital channels. In this way, digital channels 218 can process the response data and detect faulty chips in the same way that response data is processed for traditional chip testing.

Figure 3:
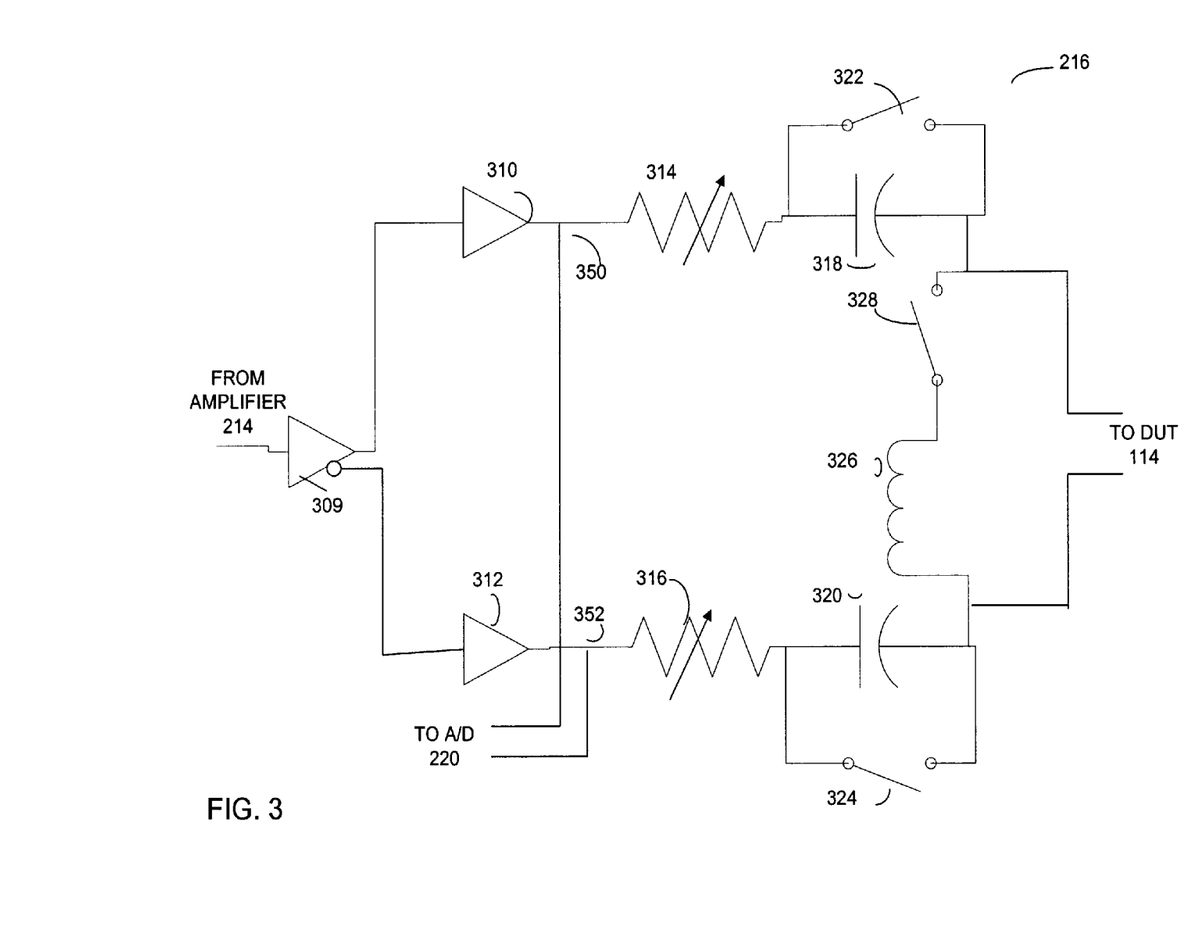
FIG. 3 shows the RFID interface of FIG. 2 in grater detail.

Turning now to FIG. 3, additional details of an RF interface circuit 216 are shown. The input to RF interface circuit 216 is derived from amplifier 214. As described above, the input represents the modulated RF carrier signal. This signal is applied to amplifier 309, which provides a differential version of the signal. In operation, the terminals 132 and 134 would be connected to opposite ends of a loop that acts like an antenna. Thus, the signals on them are preferably opposite in phase, which results from using the differential amplifier 309.

The components of the differential signal are applied to amplifiers 310 and 312. These amplifiers act as voltage to current converters. The outputs of these amplifiers simulate the current flow that would be induced in the antenna loop connected to the terminals 132 and 134 of a device in actual operation. The current range of these amplifiers is consistent with the levels of currents that might be induced in a smart card in actual operation. A range up to 100 mA is used in the preferred embodiment.

The output of amplifiers 30 and 312 are applied to a programmable coupling network that be programmed to provide many types of coupling depending to interface to smart card chips of different design or allow tests to be performed on chips under different interface conditions.

The signals are coupled next to resistors 314 and 316. These resistors can be varied by commands programmed by the user through work station 112. Selecting a higher resistance provides greater attenuation. The values of the resistors 314 and 316 can be varied to simulate a range of operating conditions, such as the distance between the smart card and the smart card reader.

Next in the coupling network are capacitors 318 and 320. These capacitors can be by-passed with switches 322 and 324. By-passing the capacitors by closing switches 322 and 324 provides direct coupling of the signal to the device under test. In contrast, leaving the switches open provides only AC coupling to the device under. As is known in the art, some tests are preferably conducted with AC coupling and some with DC coupling. For example, if the smart card chip under test is intended to operate through direct connection to a reader, testing might be done with DC coupling. As with other controls in the test system, switches 322 and 324 can be set by programming commands entered at work station 112.

The outputs of RF interface 216 are then provided to device under test 114. These outputs are provided to terminals 132 and 134 of the device under test, which are the terminals to which an antenna would be connected in actual use.

RF interface 216 additionally contains an inductor 326 that can be connected across the terminals 132 and 134 by closing switch 328. Connecting inductor 326 combines with the capacitive load between terminals 132 and 134 to create a parallel resonant circuit. As is known, the characteristics of a resonant circuit are dictated by the magnitude of the inductance and the capacitance in that circuit. Because the value of inductor 326 is known, measuring the parameters of the resonant circuit allows the capacitance inside the device under test to be measured.

As one example of a measurement that might be made, carrier DDS 210 might be programmed to generate a carrier signal that increased in frequency. DSP 226 might then monitor the output until a peak value was observed. This value would indicate that the resonant frequency of the parallel resonant circuit was reached. Using this frequency and the value of inductor 326, the capacitive load between terminals 132 and 134 could be computed.

FIG. 3 also shows points 350 and 352 at which connections are made to A/D converter 220 for measuring a response signal. As the load presented by a device under test 114 varies, the signal between points 350 and 352 will vary—thereby producing a response signal that can be measured.

Figure 4:
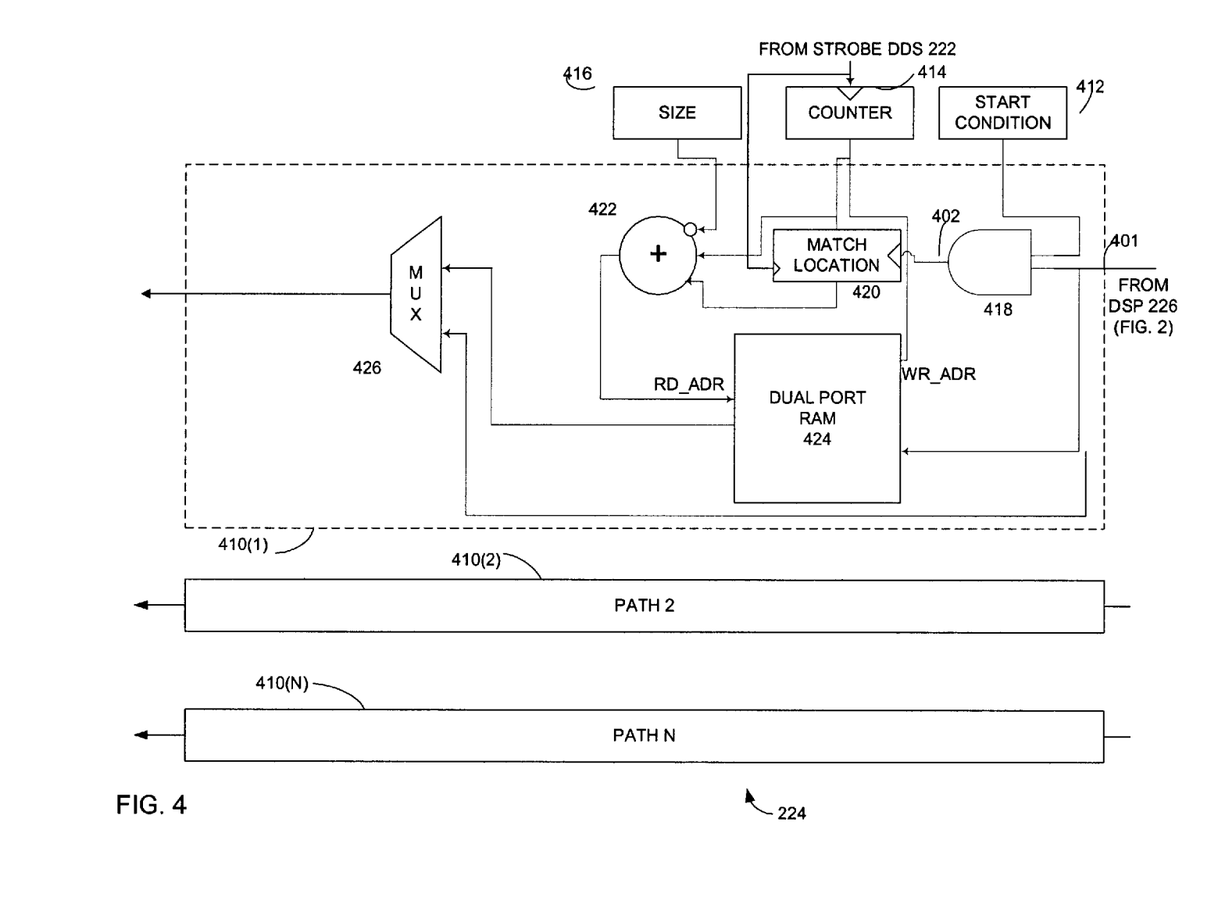
FIG. 4 shows the synchronization unit of FIG. 2 in greater detail.

Turning now to FIG. 4, greater detail of the synchronization circuit is shown.

FIG. 4 shows that there are a plurality of paths 410(1) . . . 410(N). There is one path for each device under test. The input to each path is from a DSP 226. The output of each of the paths 410(1) . . . 410(N) is coupled to one of the digital channels 218.

Synchronization circuit 224 contains some circuitry that is shared by all of the paths 410(1) . . . 410(N). Start condition 412 is a register that can be programmed with a string of data bits that represents the start condition of a response from the device under test. For example, the start condition might simply be a low or a high state. The start condition is programmed into register 412.

Register 412 is provided as an input to comparator circuit 418. The second input to comparator 418 is the demodulated data stream from DSP 226. Comparator circuit is a circuit which outputs a logic high value when the value or sequence of values represented by the start condition is detected in the demodulated data stream. Circuits to detect a particular pattern in a data stream are well known in the art and any conventional circuit for such purpose could be used.

Counter 414 is clocked by a signal derived from strobe DDS clock 222. As described above, timing generator 122 generates timing signals on a periodic basis. In a traditional tester, this period would generally be programmed to match the operating speed of the chip under test. Here, the timing signal used to clock counter 414 should be programmed to match the rate at which response bits are being generated by a device under test. Counter 414 is reset before a response signal is expected.

Counter 414 is connected to three places in the circuit. First, it provides the write address to dual port RAM 424. The data input to dual port RAM 424 comes from DSP 226. Thus, as successive values of the demodulated signal are passed to synchronization circuit 224, they are written into successive addresses of dual port RAM 424.

Here, dual port RAM 424 is acting as a buffer. The smart card chip does not usually respond instantaneously to a stimulus. Some number of cycles will pass before a response is received. However, the number of cycles is not known in advance and all of the demodulated signals are stored. Only the relevant data bits are read out of the memory and passed on for further processing.

Secondly, counter 414 is provided as an input to latch 420. Latch 420 stores the value of counter 414 when the comparator 418 outputs a logic HI. Thus, match location 420 latches the address in dual port RAM 424 where the first bit in the response data stream was stored.

Thirdly, the output of counter 414 is provided as an input to summer 422 that computes the read address. The other two inputs to summer 422 are the match location value from latch 420 and the value in the size register 416.

Size register 416 is programmed with a value that indicates the maximum number of cycles of counter 414 to detect start condition 412. A typical maximum value could be 256. In the illustrated embodiment, the value in size register 416 is used as an offset to the read address applied to dual port RAM 424.

The value in size register 416 also determines the latency in the synchronization circuit. After that latency period, the outputs of each of the paths 410(1) . . . 410(N) should be synchronized with each other. When the pattern is programmed into the digital channels 218, that latency is factored into the programming of the expected response data. In particular, the digital channels 218 are programmed to expect responses from the smart card chip under test the latency period after the stimulus is applied. In this way, the responses from each of the paths 410(1) . . . 410(N) will be synchronized with each other and with the expect data.

Of course, if there is other latency that should be taken into account when programming the time of the expect signals in the pattern data, all of the sources of latency must be combined in determining the expected time of a particular response. In that case, the value in size register 416 will be just one of the factors considered in computing the expected time.

In operation, the synchronization circuit begins to store data in dual port RAM 424 when it is enabled to expect a response from a device under test. The enable circuitry is not shown, but is conventional in digital circuitry, including automatic test equipment. Counter 414 increments for each data value and, hence each data value is stored in a successive memory location.

When comparator 418 indicates a match condition has occurred, the address at which the match occurred is stored in match location register 420. This value represents the starting address of the valid data in dual port RAM 424.

Reading from RAM 424 is not enabled until counter 414 equals the value in size register 416. The read addresses are computed by summing the value of the counter and the match location and subtracting the value in size register 416. If data is read starting when the value in counter 414 equals the value in the size register, the result of this calculation will be the value in the match location register 420 for the first read address. As previously stated, the match location register holds the address in RAM 424 of the first valid data.

Thus, after a latency set by the value in size register 416, the first valid response data will be read from RAM 424. As counter 414 successively increments, the successive data values in the response will be read from RAM 424. In this way, regardless of when the response data occurred, it will be output at a predictable time for comparison to an expected response.

In FIG. 4, the output of RAM 424 is provided to a 2-way multiplexer 426. The other input to multiplexer 426 is the response data without synchronization. Multiplexer 426 switches from unsynchronized data to synchronized data after the number of clock cycles in size register 416 has been reached, provided the start condition was encountered in the data stream. Multiplexer 426 allows the response data to be observed during the synchronization process, if desired, but might optionally be omitted if this function is not required.

It should be appreciated that FIG. 4 represents the logical design of synchronization circuit. As is known in the art, multiple physical designs could be used to implement this logical design. For example, all of the components might be implemented in an FPGA chip. Or, size register 416 and start condition register 412 could be memory locations in a memory chip configured to also provide a dual port RAM 424.

Turning now to FIG. 5, details of a possible algorithm that could be used to detect modulation on the carrier imposed by a smart card chip under test are shown. As described above DSP's 226 are used to detect modulation in an RF carrier imposed by a device under test and to determine whether, at any given time, the modulation signals a logic 1 or a logic 0. As is known, a DSP can be programmed to perform many different signal processing algorithms.

Figure 5A:
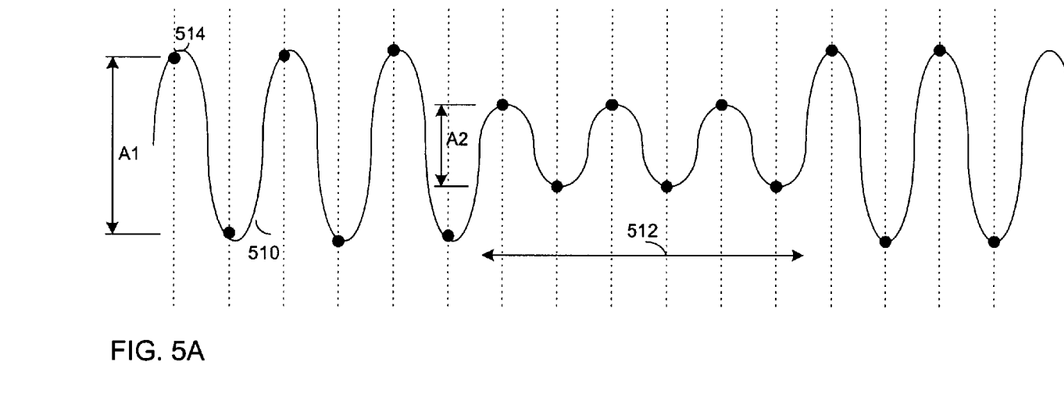
FIG. 5 is a sketch illustrating a demodulation scheme useful in connection with the present invention.

FIG. 5A shows an RF carrier 510, such as would be generated by carrier DDS 210. In the illustrated embodiment, strobe DDS 222 (FIG. 2) is programmed to cause A/D converters 220A . . . 220N to take two samples per cycle of the RF carrier. FIG. 5A shows sample points 514, which are evenly spaced.

At the left side of waveform 510, the difference in amplitude between successive samples is indicated by A1. However, in region 512, the amplitude of RF carrier 510 drops, indicating that there is amplitude modulation on the carrier. The difference between the amplitude of successive samples changes to A2. Region 512 might represent a data value of a logical 1. Thus, DSP 226 could be programmed to recognize logical 1's and 0's by detecting changes in the amplitude difference between successive samples.

Figure 5B:
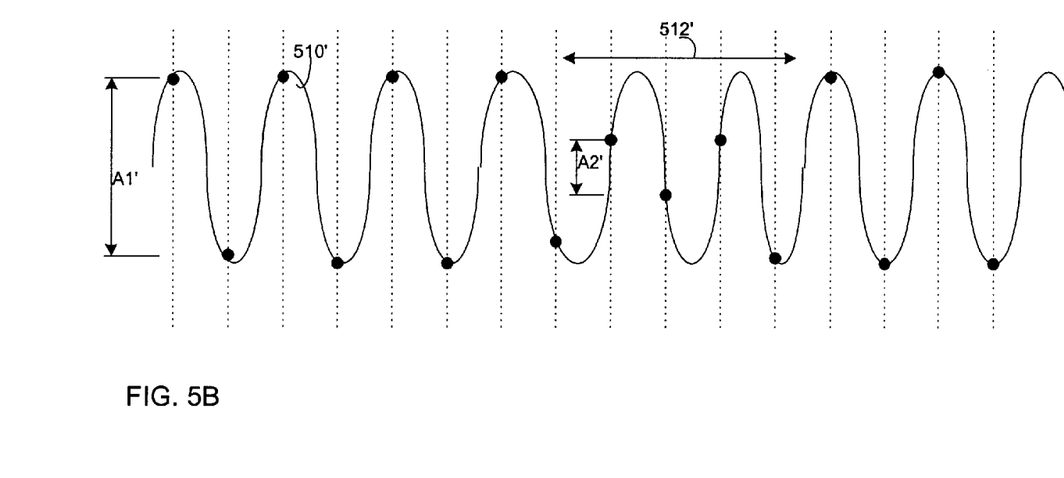

FIG. 5A depicts modulation on RF carrier 510 when the smart card chip under test varies a resistive load in order to modulate the carrier. FIG. 5B illustrates a modulated waveform 510' when the smart card chip under test varies a capacitive load to modulate the RF carrier. Region 512' indicates an area where RF carrier 510' has been phase shifted, which might represent a logical 1. Because the sampling interval is synchronous with the carrier, a phase shift results in a change in the amplitude difference between successive samples. Thus, a technique in which DSP 226 is programmed to detect changes in amplitude between successive samples yields the correct result regardless of whether the smart card chip under test modulates the carrier by varying a resistive load or a capacitive load.

DSP 226 can be programmed to detect logical 1's and 0's modulated on the carrier based on the amplitude difference between successive samples. In a preferred embodiment, DSP 226 uses 2 bits to represent the state of the modulating signal. If the difference between successive pulses exceeds some upper threshold amount, DSP 226 might set one of the bits to 1. When the difference falls below some lower threshold amount, DSP 226 might set that bit to 0. When DSP 226 detects a difference in some middle range, it might set the second bit to a logical 1 as an indication that the detected modulation falls in a region that does not correspond to either a 1 or a 0.

The specific levels might be set to predetermined levels based on knowledge of the device under test. Alternatively, the specific threshold levels might be set based on measurements of the device under test. Changes might be processed statistically to determine ranges of the values from which appropriate thresholds could be set.

Having described one embodiment, numerous alternative embodiments or variations might be made. For example, it should be recognized that the preferred embodiment is implemented with many features that can be programmed. Where advance information is known about the devices under test, some of the flexibility that allows this programming might be omitted to save cost.

As another example, it was described that a digital channel is on a single board. In some testers, the pattern generator 120 is separate from the digital channel board. Also, in some instances, the timing generator has global components that are separate from the digital channel board. Thus, it should be recognized that the partitioning of the circuit elements onto circuit boards is not an essential feature of the invention.

As another example of variation, it was described that the carrier and strobe signals were synthesized using DDS circuits driven by the same clock. A similar result could be obtained by providing a clock at the required strobe frequency. The frequency of the strobe clock could be divided by two and the resulting clock used to generate the carrier signal. Other techniques, such as PLLs could alternatively be used to generate clocks with the required frequency and synchronization.

Also, it should be appreciated that the concepts described herein are not limited to applications where synchronization of the stimulus RF waveform and sampling for the response signals are required. If, for example, the response signals are sampled at a higher frequency than the RF carrier, different signal processing algorithms could be programmed into DSP 226 to detect response signals that would not rely on synchronized sampling. Such a condition might occur if strobe DDS 222 generated a sampling clock at a higher frequency that carrier DDS 210 generated the RF carrier. Alternatively, not all smart cards generate response signals by modulating the RF carrier that is provided as an input. Some indicate responses by generating a lower frequency carrier that is modulated with the response data. The lower frequency signals require less power to generate, but the RF carriers from the devices under test are not synchronized either to the input RF signal or to each other. If such cases, though, DSPs 226 must generate data values at the same rate that response bits are expected from the device under test so that the response values can be properly stored in successive locations in RAM 424. Various DSP programming and buffering techniques could be employed if operation in this fashion were desired.

Also, it was described that tester 110 had traditional digital channel boards 118 and a smart card chip test board 120. A test system could be made with just smart card chip test boards. However, it is possible that both traditional digital channel boards and smart card test boards will be used to test smart card chips. For example, connection s to a device under test are not limited to the I/O pads. There might be other pads on the chip which could be probed during a test. In that case, PMU's traditionally found on digital channel boards might be used to measure voltages at various probe points on the chips under test. Likewise, traditional digital channels could be used to measure digital signals at other probe points, if any are present.

As another example, it will be appreciated that the combination of A/D 220 and DSP 226 create a demodulation circuit. While this implementation is preferred, it is not necessary that the demodulator be done digitally or that a DSP circuit be used for the demodulation.

As yet another example, it is described that the RF carrier signal is coupled to the device under test through a network that includes a resistance and could have a capacitor switched into it. Coupling could also be accomplished through a transformer. However, transformers are not presently preferred because they are larger and operate over a narrower frequency range.

Also, it is described that there is one DSP per device under test. It will be appreciated that a single DSP might be fast enough to process signals from multiple devices under test. Thus, it might not be necessary to have one DSP per DUT.

In addition, various embellishments might be made on the circuitry described above. For example, synchronization circuit 224 could include circuitry that would indicate an error condition of the start condition were not detected before the "size" had been exceeded.

As another variation, it should be noted that the preferred embodiment includes several parameters that can be programmed for greater flexibility in testing smart card chips of different design or testing chips under different operating conditions. The invention could be constructed without such flexibility. For example, FIG. 4 shows a size register 416 that can be programmed. It is not necessary that the size value be programmable. For example, the maximum possible delay could be hard wired into the synchronization circuitry.

As another example, it was described that all response data is stored in dual port RAM 424. The circuit could also function by having the storage function disabled until a match is detected indicating that a valid response has been detected. Another possible embellishment is that, if a match is not detected by comparator 418 before the counter 414 exceeds the value in the size register 416, an error has likely occurred. Circuitry could be added to signal to the failure processor in digital channels 218 that such an error occurred.

Further, FIG. 4 shows a register 412 to store the start condition, such as a high or low state. More complicated start conditions might be employed by a smart card chip, such as a particular pattern of highs and lows or a transition from one state to another. Start condition 412 could be programmed to store a representation of whatever states or sequence of states are used by a smart card to signal the start of a data transmission.

Also, the preferred embodiment used strobe DDS 222 to clock the counter 414, which keeps track of the number of periods of a data signal. This arrangement is most useful when the strobe clock is synchronous with the data stream, which occurs in the preferred embodiment because the RF carrier and the strobe clock are generated from the same base clock. If this condition is not true, the counter might be clocked by another source, such as the timing signals from the digital channels or even by a clock recovered from the data stream from the device under test. Digital signal processing techniques for recovering a clock from a data stream are known. DSP 226 could be programmed to recover a clock if desired.

Further, FIG. 5 describes a general algorithm that might be used to demodulate a signal. Numerous embellishments might be made. For example, averaging of filtering techniques could be used to reduce the effects of noise.

Moreover, it is described above that the smart card chip under test is tested solely through its RFID interface. Very simple smart card chips, such as those used in tags or identification cards, contain little or no data processing circuitry and contain only a memory that stores or outputs data in response to a command. Such chips might be fully tested through the RFID interface. Other chips that contain more complicated circuitry might be tested through test access pads so that their full functionality might be tested quickly. Just their RFID interfaces would be tested using smart card chip test boards 130. However, the tester described above has the flexibility to accommodate testing in many different modes.

Therefore, the invention should be limited only by the spirit and scope of the appended claims.

What is claimed is:

1. A method of manufacturing a plurality of semiconductor devices for use in smart cards, the method comprising the steps:
   a) generating a stimulus pattern for application to the plurality of semiconductor devices, the devices responding to the stimulus pattern by producing respective output signals;
   b) receiving the output signals from the semiconductor devices;
   c) synchronizing the received outputs, the synchronizing step including
      i) buffering a response signal representing a stream of data values from each of the semiconductor devices,
      ii) detecting the start of a response from each of the semiconductor devices,
      iii) outputting a plurality of streams of data values from the buffering step to a failure processor in response to the detecting step, with all of the streams synchronized at the failure processor based on the time of response of the semiconductor device generating the response signal;
   d) comparing expected responses from the plurality of semiconductor devices to actual responses; and
   e) identifying failing semiconductor devices from passing semiconductor devices based on the comparing step.

2. The method of claim 1 wherein the generating step includes:
   a) producing an RF carrier signal; and
   b) modulating the RF carrier signal and the stimulus pattern for application to the plurality of semiconductor devices.

3. The method of claim 1 wherein the received outputs comprise modulated output signals and the receiving step further includes:
   a) demodulating the modulated output signals; and
   b) providing a demodulated data stream for the synchronizing step.

4. A method of manufacturing smart cards, the method comprising the steps:
   a) testing a plurality of smart card chips according to the steps
      i) generating a stimulus pattern for application to the plurality of smart card chips, the generating step further comprising
         a) producing an RF carrier signal, and
         b) modulating the RF carrier signal and the stimulus pattern for application to the plurality of semiconductor devices, the smart card chips responding to the modulated RF carrier signal and the stimulus pattern by producing respective output signals;
      ii) receiving the output signals from the devices under test;
      iii) synchronizing the received outputs;
      iv) comparing expected responses from the plurality of smart card chips to actual responses;
      v) identifying failing smart card chips from passing smart card chips based on the comparing step; and
   b) utilizing the passing smart card chips for smart cards.

5. The method of claim 4 wherein the synchronizing step includes:
   a) buffering a response signal representing a stream of data values from each of the semiconductor devices,
   b) detecting the start of a response from each of the semiconductor devices,
   c) outputting a plurality of streams of data values from the buffering step to a failure processor in response to the detecting step, with all of the streams synchronized at the failure processor based on the time of response of the semiconductor device generating the response signal.

6. The method of claim 4 wherein the received outputs comprise modulated output signals and the receiving step further includes:
   a) demodulating the modulated output signals; and
   b) providing a demodulated data stream for the synchronizing step.

* * * * *